United States Patent
Toyama et al.

(10) Patent No.: US 8,982,570 B2
(45) Date of Patent: Mar. 17, 2015

(54) ELECTRICALLY CONDUCTIVE PATH DEVICE

(75) Inventors: Eiichi Toyama, Kosai (JP); Kazuyuki Ogawa, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/982,634

(22) PCT Filed: Feb. 1, 2012

(86) PCT No.: PCT/JP2012/000663
§ 371 (c)(1), (2), (4) Date: Jul. 30, 2013

(87) PCT Pub. No.: WO2012/105248
PCT Pub. Date: Aug. 9, 2012

(65) Prior Publication Data
US 2013/0306344 A1 Nov. 21, 2013

(30) Foreign Application Priority Data
Feb. 4, 2011 (JP) ................................ 2011-022266

(51) Int. Cl.
*H05K 1/00* (2006.01)
*H01B 7/00* (2006.01)
*H05K 9/00* (2006.01)

(52) U.S. Cl.
CPC ............ *H01B 7/0081* (2013.01); *H05K 9/0098* (2013.01)
USPC ....................................................... 361/748

(58) Field of Classification Search
USPC ....................................................... 361/748
See application file for complete search history.

(56) References Cited

U.S. PATENT DOCUMENTS

| 6,498,546 | B1 | 12/2002 | Lau | |
| D697,032 | S * | 1/2014 | Ohashi et al. | D13/159 |
| 2003/0073349 | A1* | 4/2003 | Nagao et al. | 439/620 |
| 2009/0015992 | A1 | 1/2009 | Nohara et al. | |
| 2010/0132193 | A1 | 6/2010 | Yoshinaga et al. | |
| 2011/0127061 | A1* | 6/2011 | Gotou | 174/68.2 |
| 2012/0063188 | A1* | 3/2012 | Hotta et al. | 363/144 |

FOREIGN PATENT DOCUMENTS

| DE | 206295 | 1/1984 |
| JP | 10-135681 A | 5/1998 |
| JP | 2001-136632 A | 5/2001 |

OTHER PUBLICATIONS

International Search Report and Written Opinion dated Jul. 20, 2012, issued for PCT/JP2012/000663.

* cited by examiner

*Primary Examiner* — Forrest M Phillips
(74) *Attorney, Agent, or Firm* — Locke Lord LLP

(57) ABSTRACT

There is provided an electrically conductive path device which can prevent radiation noise. An electrically conductive path device includes three bus bars electrically connecting a motor unit to an inverter unit, capacitance portions creating stray capacitance and an insulator. In terms of the electrically conductive path device, switching operation of a semiconductor switch located inside an inverter of the inverter unit creates change in voltage which is transmitted to the bus bar corresponding to a path from the inverter to the motor. At that time, the change in voltage is not transmitted further to the motor but is transmitted to the bus bar corresponding to a path from the motor to the inverter via the capacitance portion formed between the facing portions, i.e. via the stray capacitance.

5 Claims, 5 Drawing Sheets

ELECTRICALLY CONDUCTIVE PATH DEVICE

TECHNICAL FIELD

The present invention relates to an electrically conductive path device including a plurality of bus bars as an electrically conductive path.

BACKGROUND ART

In recent years, hybrid vehicles are becoming more widespread. Electric vehicles have also been developed rapidly. The hybrid vehicles and the electric vehicles are mounted with a high-voltage battery, an inverter and a motor. The inverter converts direct-current (DC) power supplied from the high-voltage battery into alternating-current (AC) power which is then supplied to the motor. Specifically, the AC power is supplied to the motor via high-voltage cables. In the hybrid vehicles and the electric vehicles, since the high-voltage cables are used for an electrical connection between the inverter and the motor as described above, there is required means for preventing radiation noise from the high-voltage cables.

Patent Literature 1 discloses a conventional technology for preventing the radiation noise which is explained below with reference to the drawing.

Referring to FIG. 5, there is shown an inverter 1. The inverter 1 is covered with a conductive shield cover 2. The shield cover 2 is connected to a vehicle body 4 via a grounding wire 3 and grounded. FIG. 5 also shows a motor 5. The motor 5 is covered with a conductive shield cover 6. The shield cover 6 is connected to the vehicle body 4 via a grounding wire 7 and grounded. The inverter 1 and the motor 5 are electrically connected to each other via three shield wires 8. The shield wire 8 includes a core wire 9, an insulation member 10 and a braid 11. Each end of the braid 11 is connected to the shield cover 2, 6 via a grounding wire 12 and grounded.

In the above-described structure, the inverter 1 is supplied with DC power from a DC power source. The inverter 1, with this supplied power, produces three-phase AC power by operating a semiconductor switch located inside the inverter 1. The core wires 9 of the shield wires 8 transmit the change in voltage created by the switching operation of the semiconductor switch.

Since the shield wires 8 connected to the inverter 1 and to the motor 5 are provided with the braids 11, it is possible to prevent the radiation of electro-magnetic wave from the core wires 9 to outside by connecting the braids 11 to ground at the shield covers 2 and 6.

CITATION LIST

Patent Literature

PLT 1: Japanese Patent Application Publication No. H10-135681

SUMMARY OF INVENTION

Technical Problem

As described above, in the conventional art the radiation noise is prevented using the shield wires 8. However, it is expected that there would be increasing number of cases in which these shield wires 8 will be replaced with other electrically conductive paths. Thus, there is a need for alternative means for preventing the radiation noise.

In view of the above-described problem, an object of the present invention is to provide an electrically conductive path device which can prevent the radiation noise.

Solution to Problem

In order to achieve the above-mentioned object, the present invention provides, in a first aspect, an electrically conductive path device having two or three bus bars which electrically connect one object to the other object and a capacitance portion for creating stray capacitance, wherein the capacitance portion is formed between facing portions of the bus bars.

According to the present invention having the above-described features, when change in voltage produced at the one object is transmitted to the bus bar corresponding to a path from the one object to the other object, the change in voltage is not transmitted further to the other object but is transmitted to the bus bar corresponding to a path from the other object to the one object via the capacitance portion formed between the facing portions of the bus bars, i.e. via the stray capacity. In the present invention, the facing portions of the bus bars are formed and positioned so that facing surfaces of the facing portions of the corresponding phases have the same surface area and that the distance between the facing surfaces of the facing portions is uniform. Furthermore, the stray capacitance can be adjusted for example by adjusting the distance between the phases, by changing the surface area and/or by changing the length of the bus bars.

Furthermore, the present invention provides, in a second aspect, the electrically conductive path device described above, wherein the one object is an inverter, the other object is a motor of a moving body and the number of bus bars is three, and wherein the electrically conductive path device is further provided with an impedance matching portion formed at a connection end of the bus bars.

According to the present invention having the above-described features, when change in voltage produced by switching operation of a semiconductor located inside the inverter is transmitted to the bus bar corresponding to a path from the inverter to the motor, the change in voltage is not transmitted further to the motor but is transmitted to the bus bar corresponding to a path from the motor to the inverter via the capacitance portion formed between the facing portions of the bus bars, i.e. via the stray capacity. In addition, according to the present invention, by forming the impedance matching portions, output impedance of the inverter can be matched with input impedance of the motor. Thus, creation of a standing wave between the inverter and the motor can be avoided, thereby reducing a chance of creation of the radiating noise. Furthermore, the impedance matching portions may be formed so as to effectively prevent reflection for example by gradually decreasing or increasing the width of the impedance matching portions.

Furthermore, the present invention provides, in a third aspect, the electrically conductive path device described above, wherein the facing portions are covered with an insulator such that the facing portions are arranged with a predetermined space between each other, the space between the facing portions covered with the insulator may be a hollow space, a space filled with the insulator or a space into which a dielectric material is inserted.

According to the present invention having the above-described features, the space between the facing portions can be maintained reliably by the insulator. In addition, the capacitance can be easily adjusted. Furthermore, in the present invention, the insulator may be inserted into an overmolded or insert molded case or may be mounted inside a case made of plastic components.

Advantageous Effects of Invention

According to the first aspect of the present invention described above, the radiation noise can be prevented in the case of using the bus bars as an electrically conductive path. In this case, the stray capacitance created between the phases can be arranged larger than in the case of using the electric wires, thus the noise can be cancelled out effectively. The present invention utilizing the stray capacitance is considered as almost an ideal capacitor having an excellent frequency property. Moreover, since the present invention has a simple structure, the radiation noise can be prevented at a low cost.

According to the second aspect of the present invention described above, the change in voltage created at the inverter can be cancelled out and thus is prevented from being transmitted to the motor, thereby preventing insulation breakdown at the motor. In addition, according to the present invention, the output impedance of the inverter and the input impedance of the motor can be matched by providing the impedance matching portion, thereby preventing the creation of the standing wave between the inverter and the motor. Therefore, the present invention can prevent the creation of the radiation noise and/or can reduce the amount of the radiation noise.

According to the third aspect of the present invention described above, advantageously the distance between the respective phases can be maintained constant, and also the stray capacitance can be adjusted. Also, the present invention can provide an optimum embodiment.

DESCRIPTION OF EMBODIMENTS

Figure 1A:
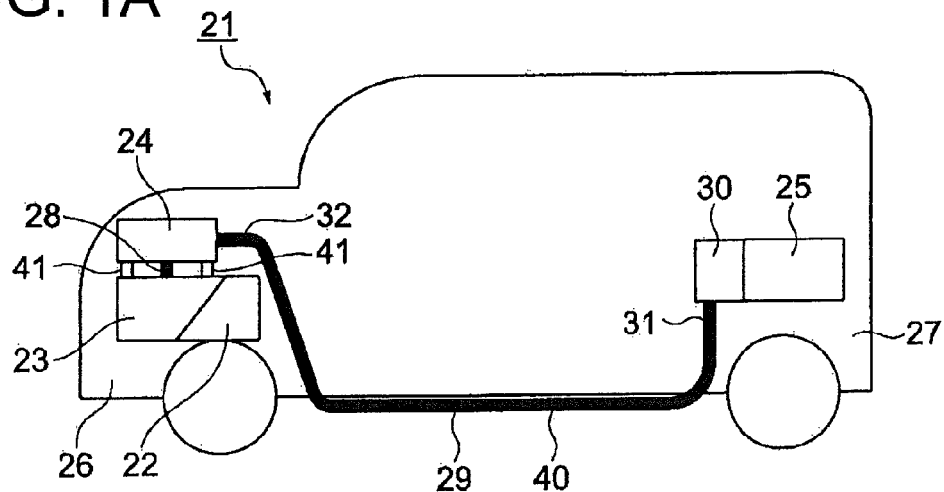
FIG. 1A is a schematic illustration of wiring configuration of an electrically conductive path device of the present invention according to a first embodiment.
Figure 1B:
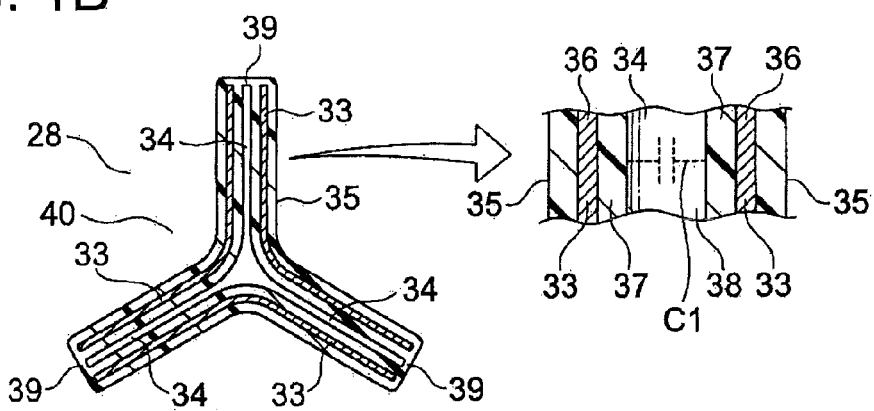
FIG. 1B shows a cross sectional view of the electrically conductive path device applied between an inverter and a motor.
Figure 1C:
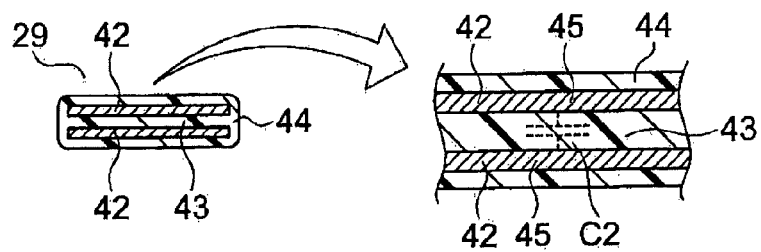
FIG. 1C shows a cross sectional view of an electrically conductive path device applied between a battery and the inverter.

The following will explain a first embodiment of the present invention with reference to the drawings. FIGS. 1A through 1C show an electrically conductive path device of the present invention according to a first embodiment, in which FIG. 1A is a schematic illustration of wiring configuration of an electrically conductive path device of the present invention according to a first embodiment, FIG. 1B shows a cross sectional view of the electrically conductive path device applied between an inverter and a motor, and FIG. 1C shows a cross sectional view of an electrically conductive path device applied between a battery and the inverter.

In this exemplary embodiment, the present invention is applied to a hybrid vehicle (or, the present invention may be applied to an electric vehicle). However, the present invention is not limited to this, and the present invention may be applied to, for example, vehicles other than the hybrid or electric vehicles. Preferably, the present invention is applied to a moving body.

Referring to FIG. 1, there is shown a hybrid vehicle 21. The hybrid vehicle 21 is driven by a combination of two power sources, an engine 22 and a motor unit 23. A battery 25 (e.g. a battery pack) supplies power to the motor unit 23 via an inverter unit 24. In this embodiment, the engine 22, the motor unit 23 and the inverter unit 24 are mounted at an engine room 26 located near front wheels. The battery 25 is mounted at a rear of vehicle 27 near rear wheels. Alternatively, the battery 25 may be mounted inside a vehicle room near the engine room 26.

The motor unit 23 and the inverter unit 24 are electrically connected to each other by an electrically conductive path device 28 of the present invention. The battery 25 and the inverter unit 24 are electrically connected to each other by an electrically conductive path device 29 of the present invention. The electrically conductive path device 28 functions similarly to a conventional motor cable (i.e. a high-voltage wire harness). The electrically conductive path device 29 functions similarly to a conventional underfloor cable (i.e. a high-voltage wire harness with its middle portion being wired under a vehicle floor). Alternatively, a conventional underfloor cable may be used instead of the electrically conductive path device 29.

The electrically conductive path device 29 and the battery 25 are connected to each other via a junction box 30 mounted to the battery 25. A rear end 31 of the electrically conductive path device 29 is electrically connected to the junction box 30. Thus, a portion of the electrically conductive path device 29 adjacent the rear end 31 is wired inside the vehicle above the vehicle floor. In addition, a portion of the electrically conductive path device 29 adjacent a front end 32 of the electrically conductive path device 29 is also wired above the vehicle floor. The front end 32 of the electrically conductive path device 29 is electrically connected to the inverter unit 24.

In this embodiment, the motor unit 23 includes a motor and a generator, and the inverter unit 24 includes an inverter and a converter. The motor unit 23 further includes a shield cover. The inverter unit 24 is also provided with a shield cover. The battery 25 may be a modularized Ni-MH battery or a Li-ion battery. Alternatively, an electric storage device such as a capacitor may be employed. Types and kinds of the battery 25 are not limited to the ones described above, unless they can be used in the hybrid vehicle 21 or in an electric vehicle.

Referring to FIGS. 1A and 1B, the electrically conductive path device 28 is provided with three bus bars 33 which electrically connect the motor unit 23 to the inverter unit 24, an insulator 35 and capacitance portions 34 which create stray capacitance C1.

The bus bars 33 correspond to an electrically conductive path for supplying three-phase AC power, and all of the three bus bars are formed into the same shape. The bus bars 33 are provided with facing portions 36. These facing portions 36 of the respective bus bars 33 are arranged so that the corresponding facing portions 36 are arranged to face each other. The three bus bars 33 are formed into a suitable shape and positioned in a suitable manner so as to create the uniform stray capacitance C1 between the three phases. Thus, the facing portions 36 are formed and positioned so that the facing surfaces of the facing portions 36 have the same surface area and that the distance between the facing surfaces of the facing portions 36 is uniform.

The capacitance portion 34 is formed between the facing portions 36 of the respective bus bars 33. In this embodiment, the capacitance portion 34 includes inner covers 37 disposed between the facing portions 36 and a hollow space 38 located between the inner covers 37. Such arrangement is described by way of example only, and it is also effective if the hollow space 38 is filled with the insulator 35 or includes a dielectric material inserted into the hollow space 38. The inner cover 37 is formed by the insulator 35. The stray capacitance C1 can be adjusted by adjusting the distance between the bus bars, by changing the surface area and/or by changing the length of the bus bars 33.

The insulator 35 is arranged to cover the respective bus bars 33 to ensure insulation property of the bus bars 33. The insulator 35 is provided with a spacing portion 39 to maintain the facing portions 36 to be spaced apart from each other at a predetermined interval.

The three bus bars 33 are provided with an impedance matching portion arranged at a connection end located at each end of the bus bars 33. That is, the impedance matching portion is formed at an end of a main body 40 of the electrically conductive path device described above. The impedance matching portion will be explained in more detail below.

In terms of the electrically conductive path device 28, by operating a semiconductor switch (e.g. IGBT) located inside the inverter of the inverter unit 24, change in voltage is created and transmitted to the bus bar 33 corresponding to a path from the inverter to the motor. At that time, the change in voltage is not transmitted further to the motor but is transmitted to the bus bar 33 corresponding to a path from the motor to the inverter via the capacitance portion 34 formed between the facing portions 36 of the bus bars 33, i.e. via the stray capacitance C1.

Therefore, the electrically conductive path device 28 is arranged to effectively cancel out the noise. Due to this effect, insulation breakdown can be prevented around the motor unit 23.

As will be appreciated from the foregoing, the electrically conductive path device 28 is obviously an effective technology although it is different from the radiation noise prevention technology of the conventional art which uses common-mode current.

In this embodiment, the inverter unit 24 is fixed directly above the motor unit 23. That is, the inverter unit 24 and the motor unit 23 are disposed adjacent to each other. Thus, the length of the electrically conductive path device 28 is short. The inverter unit 24 is fixed directly above the motor unit 23 by the fixation legs 41.

Referring to FIGS. 1A and 1C, the electrically conductive path device 29 for electrically connecting the battery 25 to the inverter unit 24 is provided with two bus bars 42, a capacitance portion 43 for creating stray capacitance C2, an insulator 44 and a tubular protective member (not shown) for covering and protecting the bus bars 42, the capacitance portion 43 and the insulator 44.

The two bus bars 42 correspond to a positive electrically conductive path and a negative electrically conductive path, respectively, and are formed into the same shape. The two bus bars 42 are arranged so that facing portions 45 of the bus bars 42 are arranged to face each other. Furthermore, the two bus bars 42 are formed into a suitable shape and positioned in a suitable manner so as to create the uniform stray capacitance C2 between these two phases.

The electrically conductive path device 29 functions similarly to and has an effect similar to the electrically conductive path device 28 described above.

The following will explain some exemplary embodiments of an electrically conductive path device for electrically connecting the motor unit 23 to the inverter unit 24.

Exemplary Embodiment 1

Figure 2A:
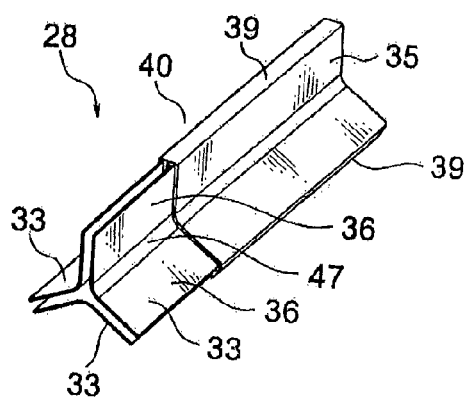
FIG. 2A shows a perspective view of a main body of electrically conductive path device according to the first embodiment applied between the inverter and the motor.
Figure 2B:
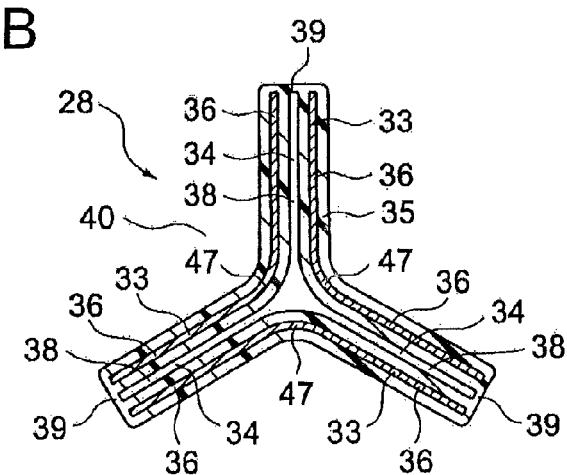
FIG. 2B shows a cross sectional view of the main body of electrically conductive path device shown in FIG. 2A.
Figure 2C:
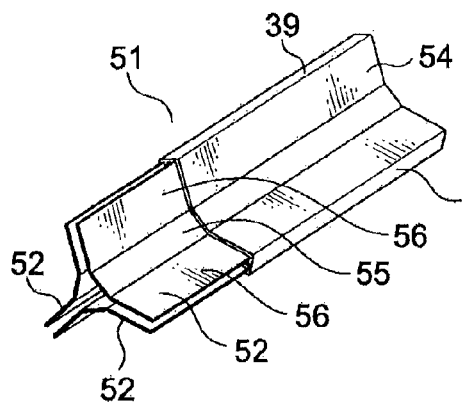
FIG. 2C shows a perspective view of a modified example of FIG. 2A.
Figure 2D:
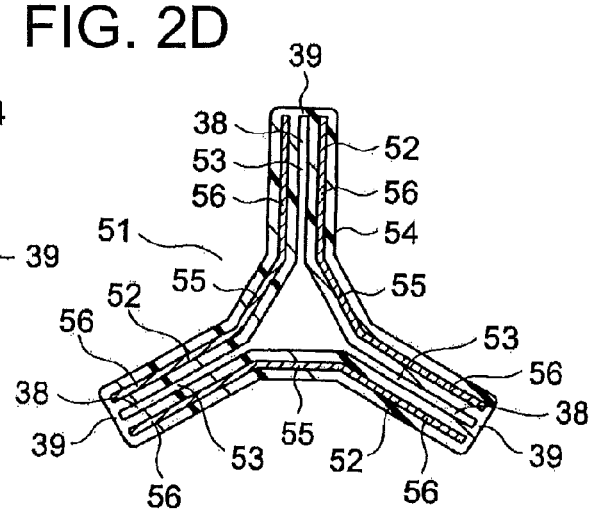
FIG. 2D shows a cross sectional view of the modified example of FIG. 2A.
Figure 3A:
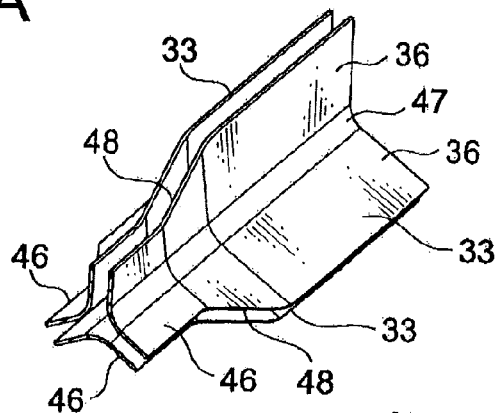
FIG. 3A shows a perspective view of an impedance matching portion of the electrically conductive path device shown in FIG. 2A.
Figure 3B:
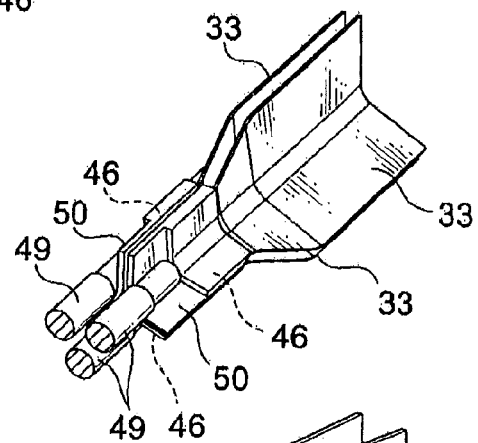
FIG. 3B shows a perspective view of a connection structure of FIG. 3A.
Figure 3C:
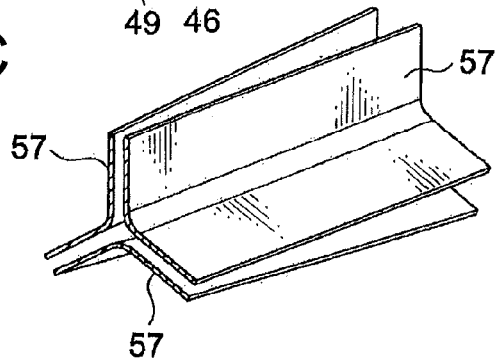
FIG. 3C shows a perspective view of a modified example of FIG. 3A.
Figure 3D:
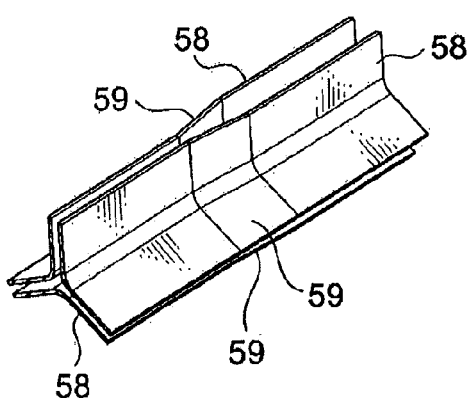
FIG. 3D shows a perspective view of another modified example of FIG. 3A.

The following will explain an exemplary embodiment 1 with reference to the drawings. FIGS. 2A through 2D show an electrically conductive path device arranged between an inverter and a motor, in which FIG. 2A is a perspective view of a main body of the electrically conductive path device, FIG. 2B is a cross sectional view of the main body of the electrically conductive path device shown in FIG. 2A, FIG. 2C is a perspective view of a modified example of FIG. 2A, and FIG. 2D is a cross sectional view of the modified example of FIG. 2A. Furthermore, FIG. 3A shows a perspective view of an impedance matching portion of the electrically conductive path device shown in FIG. 2A, FIG. 3B is a perspective view of a connection structure of FIG. 3A, FIGS. 3C and 3D show perspective views of modified examples of FIG. 3A.

Referring to FIGS. 2A and 2B, a main body 40 of the electrically conducting path device 28 includes three bus bars 33, capacitance portions 34 and an insulator 35. There is also provided an impedance matching portion 46 formed at an end of the man body 40 as shown in FIG. 3A. The impedance matching portion 46 and the main body 40 together constitute the electrically conductive path device 28.

The bus bar 33 is formed by punching a conductive metal plate to obtain a strip, followed by bending the strip at the widthwise center into an L-shape. In the drawings there is shown a bent portion 47, the facing portions 36 being continuously formed at both ends of the bent portion 47. All of three bus bars 33 are formed into the same shape. These three bus bars 33 are formed and positioned such that the facing portions 36 are arranged at an equal interval with respect to each other.

The capacitance portion 34 is formed between the facing portions 36 of the respective bus bars 33. Furthermore, the capacitance portions 34 are arranged so as to create the uniform stray capacitance C1 between the phases (refer to FIG. 1B). The insulator 35 is arranged to cover the respective bus bars 33 to ensure insulation property of the bus bars 33.

Referring to FIG. 3A, the impedance matching portion 46 is arranged so that output impedance of the inverter is matched with input impedance of the motor. Furthermore, the impedance matching portion 46 is formed so that the width of the bus bars 33 is gradually decreased (e.g. by forming a tapered portion 48). The gradually changing width described above can effectively prevent reflection.

An end of the impedance matching portion 46 corresponds to a connection end. In terms of the connection between the inverter and the motor via the connection end, the connection end may be arranged into a shape suitable for a direct connection (not shown) or may be provided with electric wires 49 as shown in FIG. 3B.

Preferably, a portion of the electric wire 49 for connection is insulated by an insulator 50 by overmolding and such.

The electrically conductive path device 28 is not limited to the above-described embodiment. That is, the shape of the electrically conductive path device 28 may be modified as shown in FIGS. 2C and 2D.

As shown in FIGS. 2C and 2D, a main body 51 of the electrically conductive path device includes three bus bars 52, capacitance portions 53 and an insulator 54.

The bus bar 52 is formed by punching a conductive metal plate to obtain a strip, followed by bending the strip at the widthwise center into an L-shape. In the drawing there is shown a bent portion 55, in which facing portions 56 are continuously formed at both ends of the bent portion 55. All of three bus bars 52 are formed into the same shape. These three bus bars 52 are formed and positioned such that the facing portions 56 are arranged at an equal interval with respect to each other. In addition, the three bus bars 52 are arranged so that the facing portions 56 have the same surface area with respect to each other. Thus, the bus bar 52 has the larger bent portion 55 and the smaller facing portion 56 compared to the bus bar 33.

By changing the shape of the bus bar 52, the stray capacitance of the main body 51 of the electrically conductive path device is adjusted.

In terms of the adjustment of the stray capacitance, it is effective to gradually change the interval between respective three bus bars 57 as shown in FIG. 3C. Furthermore, as shown in FIG. 3D, it is also effective to provide an interval adjustment portion 59 at a central portion of each of three bus bars 58.

Exemplary Embodiment 2

Figure 4A:
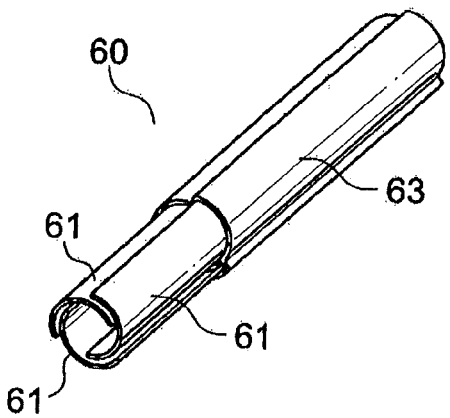
FIG. 4A shows a perspective view of a main body of electrically conductive path device of the present invention according to a second embodiment applied between the inverter and the motor.
Figure 4B:
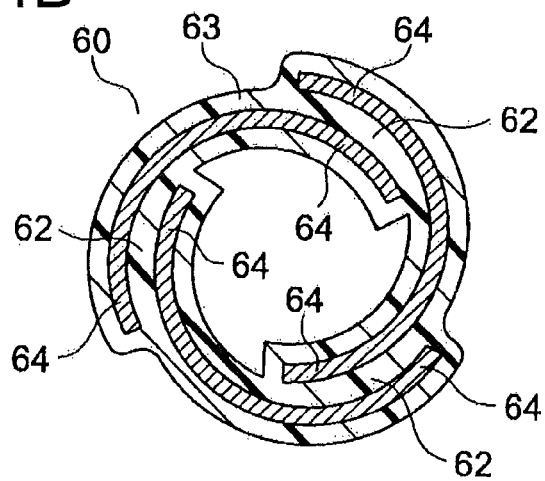
FIG. 4B shows a cross sectional view of the main body of electrically conductive path device shown in FIG. 4A.
Figure 4C:
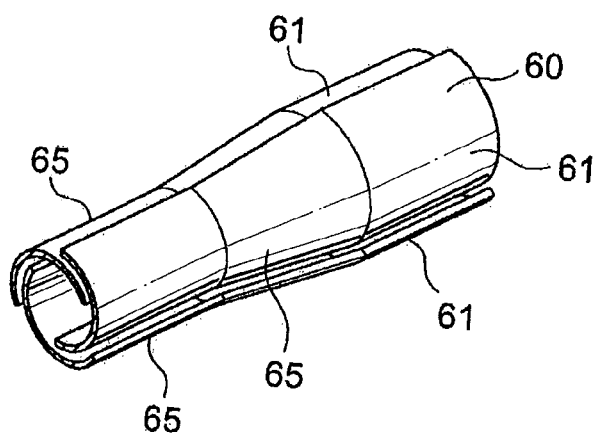
FIG. 4C shows a perspective view of a modified example of FIG. 4A.
Figure 5:
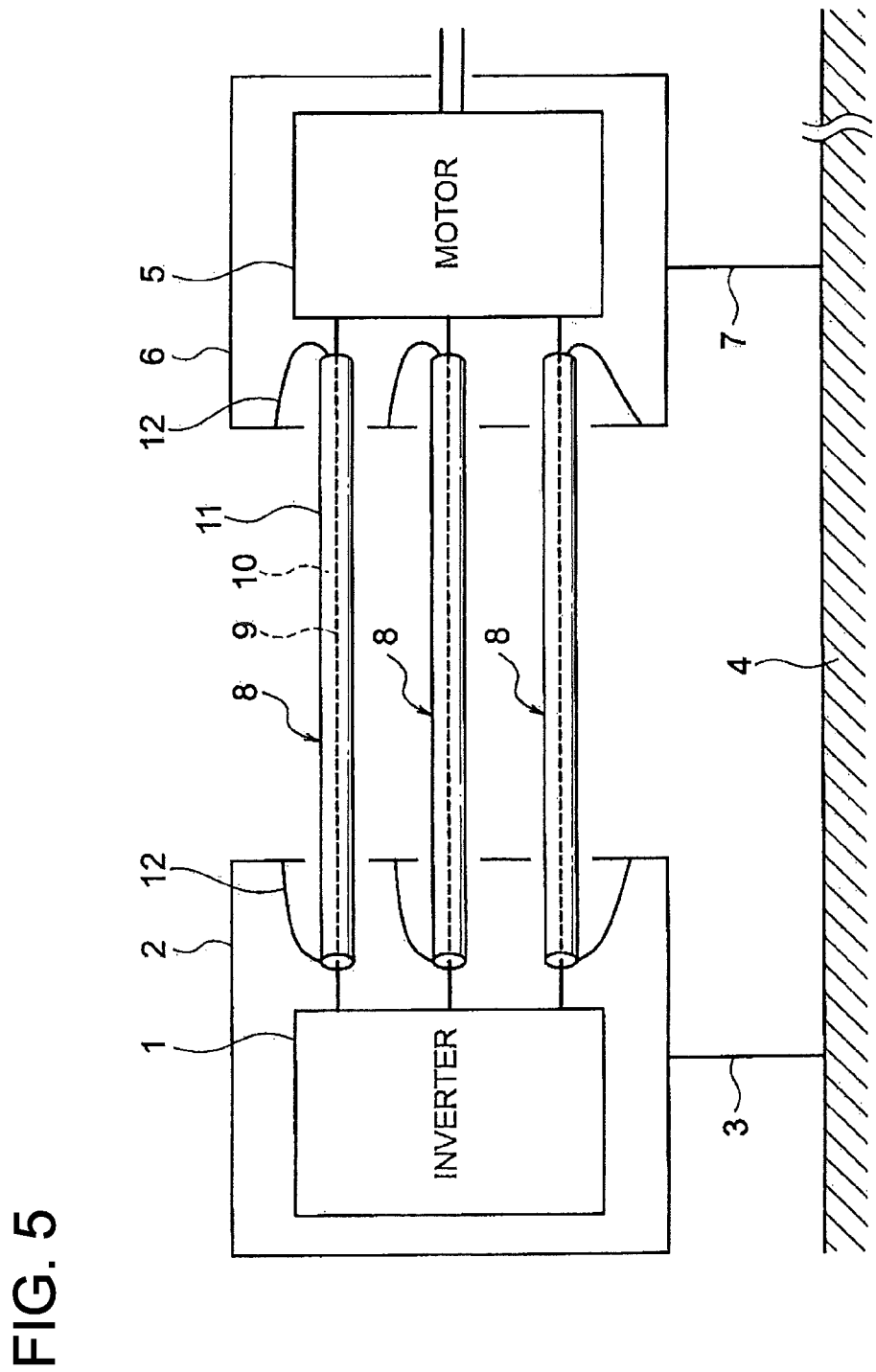
FIG. 5 is an illustration of a conventional art for preventing radiation noise.

The following will explain an exemplary embodiment 2 with reference to the drawings. FIGS. 4A through 4C show an electrically conductive path device applied between the inverter and the motor, in which FIG. 4A is a perspective view of a main body of the electrically conductive path device, FIG. 4B is a cross sectional view of the main body of the electrically conductive path device shown in FIG. 4A, and FIG. 4C is a perspective view of a modified example of FIG. 4A.

Referring to FIGS. 4A and 4B, a main body 60 of the electrically conductive path device includes three bus bars 61, capacitance portions 62 and an insulator 63.

The bus bar 61 is formed by punching a conductive metal plate to obtain a strip, followed by bending the strip at the widthwise center into an L-shape. In the drawings, there are shown facing portions 64 of the bus bars 61. The three bus bars 61 are formed and positioned such that the facing portions 64 are arranged to face each other at an equal interval with respect to each other. Thus, the three bus bars 61 form a tubular shape.

The capacitance portion 62 is formed between the facing portions 64 of the respective bus bars 61. Furthermore, the capacitance portions 62 are arranged so as to create the uniform stray capacitance between the phases. In this embodiment, the capacitance portions 62 are filled with an insulator 63 (alternatively, the capacitance portion 62 may be a hollow space or may include a dielectric material inserted into the capacitance portion). The insulator 63 is arranged to cover the respective bus bars 61 to ensure insulation property of the bus bars 61.

As shown in FIG. 4C, an impedance matching portion 65 is formed at an end of the electrically conductive path device. The impedance matching portion 65 is formed so that the width of the bus bars 61 is gradually decreased (e.g. by forming a tapered portion 48). The gradually changing width described above can effectively prevent reflection.

It should be apparent that the electrically conductive path devices shown in FIGS. 4A through 4C function similarly to and have an effect similar to the electrically conductive path device 28 shown in FIGS. 1A-1C, 2A-2D and 3A-3D.

Also, it should be apparent that the present invention can be modified and practiced in various ways without departing from the spirit of the present invention.

REFERENCE SIGNS LIST

C1, C2 stray capacitance
21 hybrid vehicle (moving body)
22 engine
23 motor unit
24 inverter unit
25 battery
26 engine room
27 rear of vehicle
28, 29 electrically conductive path device
30 junction box
31 rear end
32 front end
33 bus bar
34 capacitance portion
35 insulator
36 facing portion
37 inner cover
38 hollow space
39 spacing portion
40 main body of electrically conductive path device
41 fixation leg
42 bus bar
43 capacitance portion
44 insulator
45 facing portion
46 impedance matching portion
47 bent portion
48 tapered portion
49 electric wire
50 insulation portion
51 main body of electrically conductive path device
52 bus bar
53 capacitance portion
54 insulator
55 bent portion
56 facing portion
57, 58 bus bar
59 interval adjustment portion
60 main body of electrically conductive path device
61 bus bar
62 capacitance portion
63 insulator
64 facing portion
65 impedance matching portion

The invention claimed is:

1. An electrically conductive path device comprising:
   three bus bars which electrically connect one object to the other object and
   a capacitance portion for creating stray capacitance,
   wherein the capacitance portion is formed between facing portions of the bus bars, and
   wherein the three bus bars are formed into a same shape, and are positioned so that a surface area of the facing portions and a distance between the facing portions are uniform.

2. The electrically conductive path device according to claim 1, wherein
   the object is an inverter, and the other object is a motor of a moving body,
   the electrically conductive path device further comprises an impedance matching portion formed at a connection end of the bus bars.

3. The electrically conductive path device according to claim 1, wherein
   the facing portions are covered with an insulator such that the facing portions are arranged with a predetermined space between each other, and
   the space between the facing portions covered with the insulator is arranged in a form selected from a group of: a hollow space, a space filled with the insulator and a space into which a dielectric material is inserted.

4. The electrically conductive path device according to claim 2, wherein
   the facing portions are covered with an insulator such that the facing portions are arranged with a predetermined space between each other, and
   the space between the facing portions covered with the insulator is arranged in a form selected from a group of: a hollow space, a space filled with the insulator and a space into which a dielectric material is inserted.

5. An electrically conductive path device comprising:
   two bus bars which electrically connect one object to the other object; and
   a capacitance portion for creating stray capacitance,
   wherein the capacitance portion is formed between facing portions of the bus bars.

* * * * *